(12) United States Patent
Lyakh

(10) Patent No.: US 10,177,535 B1
(45) Date of Patent: Jan. 8, 2019

(54) QUANTUM CASCADE LASER SYSTEM WITH POWER SCALING AND RELATED METHODS AND DEVICES

(71) Applicant: UNIVERSITY OF CENTRAL FLORIDA RESEARCH FOUNDATION, INC., Orlando, FL (US)

(72) Inventor: Arkadiy Lyakh, Oviedo, FL (US)

(73) Assignee: UNIVERSITY OF CENTRAL FLORIDA RESEARCH FOUNDATION, INC., Orlando, FL (US)

(*) Notice: Subject to any disclaimer, the term of this patent is extended or adjusted under 35 U.S.C. 154(b) by 69 days.

(21) Appl. No.: 15/450,575

(22) Filed: Mar. 6, 2017

Related U.S. Application Data

(60) Provisional application No. 62/303,513, filed on Mar. 4, 2016.

(51) Int. Cl.
*H01S 5/34* (2006.01)
*H01S 5/12* (2006.01)

(52) U.S. Cl.
CPC .............. *H01S 5/3401* (2013.01); *H01S 5/12* (2013.01)

(58) Field of Classification Search
CPC ................................. H01S 5/3401; H01S 5/12
See application file for complete search history.

(56) References Cited

U.S. PATENT DOCUMENTS

| | | | |
|---|---|---|---|
| 6,582,376 B2 | 6/2003 | Baghdassarian |
| 7,004,909 B1 | 2/2006 | Patel et al. |
| 7,064,329 B2 | 6/2006 | Webber |
| 8,068,524 B1 | 11/2011 | Patel et al. |
| 8,121,164 B1 | 2/2012 | Lyakh et al. |
| 8,994,947 B2 | 3/2015 | Patel et al. |
| 9,077,153 B2 | 7/2015 | Maulini et al. |
| 9,608,408 B2 | 3/2017 | Lyakh et al. |
| 2003/0038237 A1 | 2/2003 | Webber |
| 2003/0067946 A1 | 4/2003 | Wiemeyer |
| 2003/0109795 A1 | 6/2003 | Webber |
| 2007/0229834 A1 | 10/2007 | Patel et al. |
| 2008/0159341 A1 | 7/2008 | Patel et al. |
| 2009/0116518 A1 | 5/2009 | Patel et al. |
| 2009/0213890 A1 | 8/2009 | Patel et al. |
| 2012/0018638 A1 | 1/2012 | Patel et al. |
| 2012/0153156 A1 | 6/2012 | Patel et al. |
| 2013/0010523 A1 | 1/2013 | Maulini et al. |
| 2013/0010823 A1 | 1/2013 | Maulini et al. |

(Continued)

Primary Examiner — Dung Nguyen
(74) Attorney, Agent, or Firm — Allen, Dyer, Doppelt + Gilchrist, PA

(57) ABSTRACT

A quantum cascade laser may include a substrate, and a semiconductor layer adjacent the substrate and defining an active region. The active region may have an elongate shape extending laterally across the substrate and having first and second lowest injector states with an energy spacing greater than 20 meV. In some embodiments, the active region may have a thickness less than or equal to 1.3 μm and a length greater than or equal to 20 μm. The quantum cascade laser may also include an optical grating adjacent the active region and configured to emit a continuous wave laser output through the substrate. The optical grating may include a curved grating pattern.

22 Claims, 6 Drawing Sheets

(56) References Cited

U.S. PATENT DOCUMENTS

2014/0247850 A1\* 9/2014 Botez ................... H01S 5/2013
 372/45.012
2015/0103857 A1 4/2015 Maulini et al.
2016/0322788 A1 11/2016 Lyakh et al.

\* cited by examiner

QUANTUM CASCADE LASER SYSTEM WITH POWER SCALING AND RELATED METHODS AND DEVICES

RELATED APPLICATION

This application is based upon prior filed Provisional Application No. 62/303,513 filed Mar. 4, 2016, the entire subject matter of which is incorporated herein by reference in its entirety.

TECHNICAL FIELD

The present disclosure relates to lasers and, in particular, to quantum cascade laser and related methods.

BACKGROUND

Quantum cascade lasers (QCLs) differ from traditional semiconductor diode lasers in that they do not use a p-n junction for light emission. Multiple active regions are "cascaded" so that each injected electron can emit multiple photons and therefore enhance laser gain. Each active region includes a multi-layered semiconductor material structure. This multi-layered semiconductor material structure is designed to have an electronic band structure that gives the desired emission wavelength, and is manufactured with nanometer-level thickness control.

Most commercially available QCLs are of the "edge-emitting" variety. In these, linear ridges are created by etching vertically through the layered structure, which has been grown on a wafer substrate. These are cleaved so that the active region comprises a rectangular ridge several millimeters in length, which forms a waveguide. The laser radiation is amplified by passing back and forth along the axis of the ridge. Laser emission occurs on the end facets of these ridges.

SUMMARY

Generally speaking, a QCL may comprise a substrate, and in some embodiments, a sequence of semiconductor layers adjacent the substrate and defining an active region. The active region may have an elongate shape extending laterally across the substrate and having first and second lowest injector states in each period of the cascade with an energy spacing greater than 20 meV. The active region may have a thickness less than or equal to 1.3 µm and a width greater than or equal to 20 µm. The QCL may include an optical grating adjacent the active region and configured to emit a continuous wave (CW) laser output through the substrate. The optical grating may include a curved grating pattern. Advantageously, the QCL may provide a single emitter higher power output.

More specifically, the semiconductor layer may comprise an epitaxial semiconductor layer. The optical grating may comprise a second order optical grating pattern. The active region may have a dopant concentration value to selectively set a dynamic range of the QCL. The curved grating pattern may be based upon a phase function. The optical grating may be configured to emit the CW laser output at a power greater than or equal to 20 watts.

For example, the active region may have a tapered shape or an angled shape. The active region may have a thickness of less than or equal to 1.2 µm. The semiconductor layer may comprise a plurality of layers defining a superlattice structure.

Another aspect is directed to a QCL system comprising a QCL, and a driver circuit coupled to the QCL. The QCL may include a substrate, and a semiconductor layer adjacent the substrate and defining an active region. The active region may have an elongate shape extending laterally across the substrate and having first and second lowest injector states with an energy spacing greater than 20 meV. The active region may have a thickness less than or equal to 1.3 µm and a width greater than or equal to 20 µm. The QCL may also include an optical grating adjacent the active region and configured to emit a CW laser output through the substrate. The optical grating comprises a curved grating pattern.

Another aspect is directed to a method for making a QCL. The method may include forming a semiconductor layer adjacent a substrate and defining an active region. The active region may have an elongate shape extending laterally across the substrate and having first and second lowest injector states with an energy spacing greater than 20 meV. The active region may have a thickness less than or equal to 1.3 µm and a length greater than or equal to 20 µm. The method may include forming an optical grating adjacent the active region and configured to emit a CW laser output through the substrate. The optical grating comprises a curved grating pattern.

DETAILED DESCRIPTION

The present disclosure will now be described more fully hereinafter with reference to the accompanying drawings, in which several embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

Figure 1:
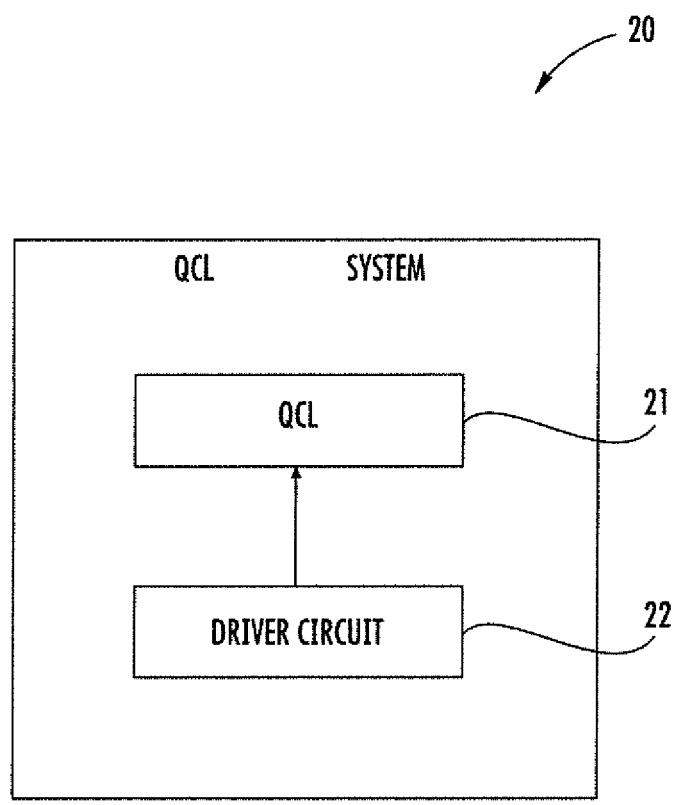
FIG. 1 is a schematic diagram of a QCL system, according to the present disclosure.
Figure 2:
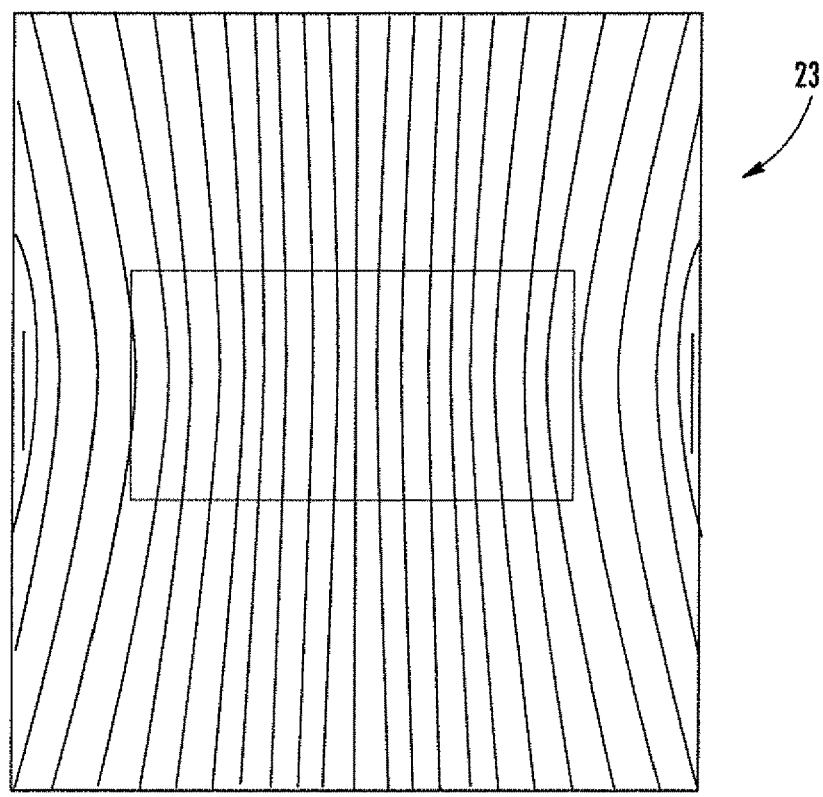
FIG. 2 is a schematic diagram of a curved distributed feedback laser grating, according to the present disclosure.
Figure 3:
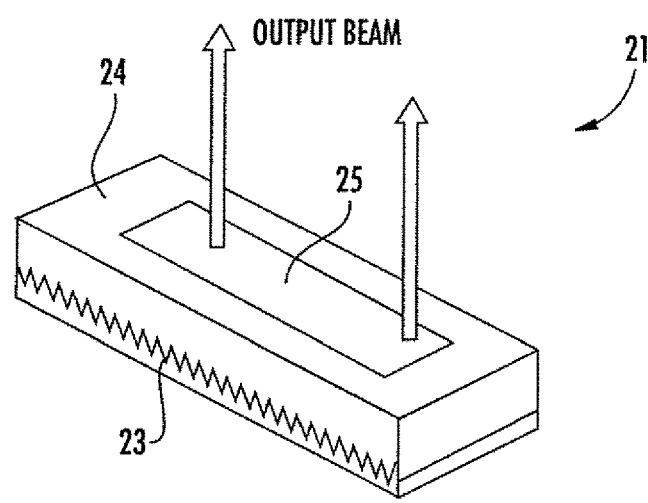
FIG. 3 is a schematic diagram of a curved-grating, substrate emitting distributed feedback configuration, according to the present disclosure.

Referring initially to FIGS. 1-3, a QCL system 20 according to the present disclosure is now described. The QCL system 10 illustratively includes a QCL 21, and a driver circuit 22 coupled to the QCL and configured to power the QCL. The QCL 21 illustratively includes a substrate (e.g. InGaAs, InAlAs, GaAs/AlGaAs, Si, SiGe) 24 having opposing first and second major surfaces, and a semiconductor layer adjacent the first major surface of the substrate (i.e. an upper surface) and defining an active region 25 abutting the first major surface. The QCL 21 illustratively includes an optical grating 23 adjacent the active region 25 and configured to emit a CW laser output through the substrate 24. The optical grating 23 is internal.

The active region 25 may have an elongate shape extending laterally across the substrate 24 and having first and second lowest injector states with an energy spacing greater than 20 meV. Also, the active region 25 may have a thickness less than 1.3 µm and width significantly exceeding 10 µm (e.g. 20 µm). In other words, the thickness to width ratio of the active region 25 is in the range of 0.13-0.013, for example.

Advantageously, by reducing active region thickness below 1.3 µm, the heat conduction of the overall active region is improved and optical power can be scaled with active region width. Also, the increasing in the energy spacing between the two lowest injector states increases carrier concentration at the ground injector state (i.e. the lowest injector state), which increases optical power per unit area of the active region. In some exemplary embodiments, the configuration of the injector states may be achieved by changing thicknesses and composition of semiconductor (e.g. epitaxial) layers formed on the substrate 24.

The optical grating 23 illustratively includes a curved grating pattern. The optical grating 23 may comprise a second order optical grating pattern. The active region 25 may have a dopant concentration value to selectively set a dynamic range of the QCL 21. The curved grating pattern may be based upon a phase function. The optical grating 23 may be configured to emit the CW laser output at a power greater than or equal to 20 watts.

For example, the active region 25 may have a tapered shape or an angled shape. The active region 25 may have a thickness of less than or equal to 1.2 µm. The semiconductor layer may comprise a plurality of layers defining a superlattice structure.

Another aspect is directed to a method for making a QCL 21. The method may include forming a semiconductor layer adjacent a substrate 24 and defining an active region 25, and forming an optical grating 23 adjacent the active region and configured to emit a CW laser output through the substrate. The optical grating 23 comprises a curved grating pattern.

In the following, an exemplary discussion regarding the QCL system 20 is provided.

INTRODUCTION

One of the biggest hurdles on the way to realization of broad area CW devices is active region self-heating. Superlattice structures have a very low thermal conductivity along the growth direction. This and the fact that a very high electrical power density (heat waste) is dissipated in a typical superlattice active region (on the order of $10^8$ W/cm$^3$) lead to a dramatic active region heating relative to heat sink temperature. The heating effects are exacerbated for broad area devices, as the lateral heat extraction path is essentially eliminated.

As shown in the following sections, active region thermal resistance can be drastically reduced and laser self-heating can be suppressed by significantly reducing active region thickness. Device modeling results presented below demonstrate that this will lead to a lower active region temperature for the same total electrical power dissipated in the thinner active region, or, which is of primary interest here, to the same average temperature for much wider devices. A question that still remains in this case is how to reduce active region thickness without compromising optical power emitted per unit area of the device, as power level is critical to many basic research areas and most, if not all, practical applications.

This problem can be illustrated as follows. The most straightforward approach to reduce active region thickness is to reduce number of active region stages. In the case of QCLs, this can be achieved by reducing number of stages from the typically used 40 stages (corresponds to thickness of 1.8-2.0 µm) to 20 stages. This will lead, however, to a proportional reduction in optical power due to reduction in slope efficiency, since the latter is proportional to the number of stages. Therefore, the basic problem addressed in this proposal is stated as follows: how does the fundamental superlattice design need to be modified so that the reduction in active region thickness does not lead to a reduction in optical power emitted per unit area? In other words, we are trying to develop an ultra-thin (2D) superlattice capable of high MWIR optical power generation per unit area. As shown below, this involves a basic study of several design aspects followed by a multifaceted fundamental design optimization.

Figure 4:
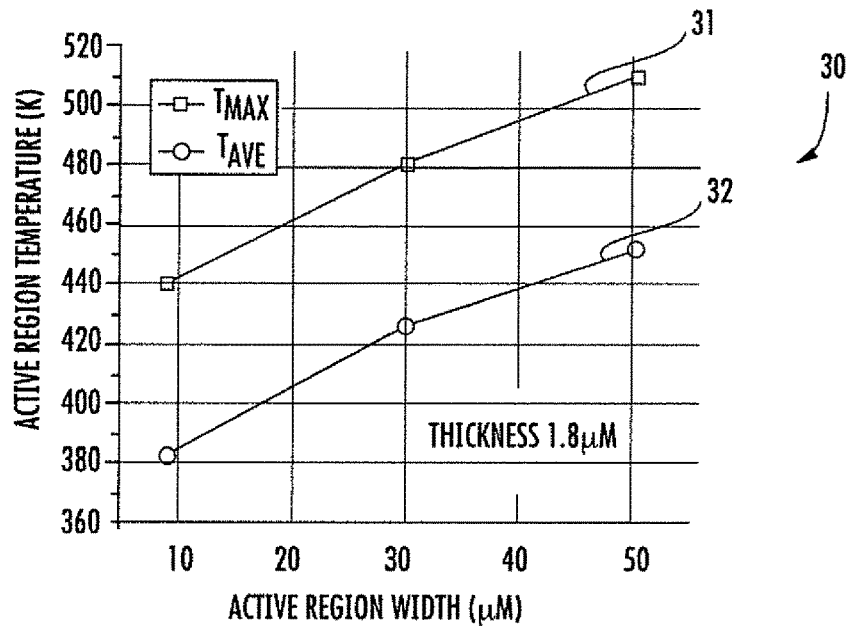
FIG. 4 is a diagram of active region temperature versus ridge width, according to the present disclosure.

Broad area configuration has never been actively pursued to increase CW or average optical power for QCLs or QCL-based structures due to a firm belief that active region self-heating would prevent CW lasing for broad area devices. Indeed, in the case of a 40-stage MWIR QCL structure, average active region temperature rise ΔT due to heat waste dissipated in the active region is projected to increase from approximately 80K for 10 µm-wide devices to over 150K for 50 µm-wide devices (diagram 30, curve 31 is $T_{max}$, curve 32 is $T_{ave}$; FIG. 4), which brings absolute device temperature above 450K. This prevents CW power scaling with ridge width as laser efficiency drops due to device overheating. The effect is strong enough to completely stop CW lasing for devices wider than 20-30 µm.

The QCL self-heating effect is largely caused by a low thermal conductivity of the active region in the growth direction. To reduce active region temperature, a traditional approach is to employ narrow ridge devices (7-10 µm), utilize semi-insulating InP lateral overgrowth buried heterostructure (BH), and mount the devices epi-side down. Even for these narrow BH devices, active region temperature drastically varies across the active region: maximum temperature rise in the center of the active region is 140K compared to the average temperature rise of 80K. The non-uniform temperature distribution, characterized as the difference between $T_{max}$ and $T_{ave}$, further reduces laser performance.

Figure 5:
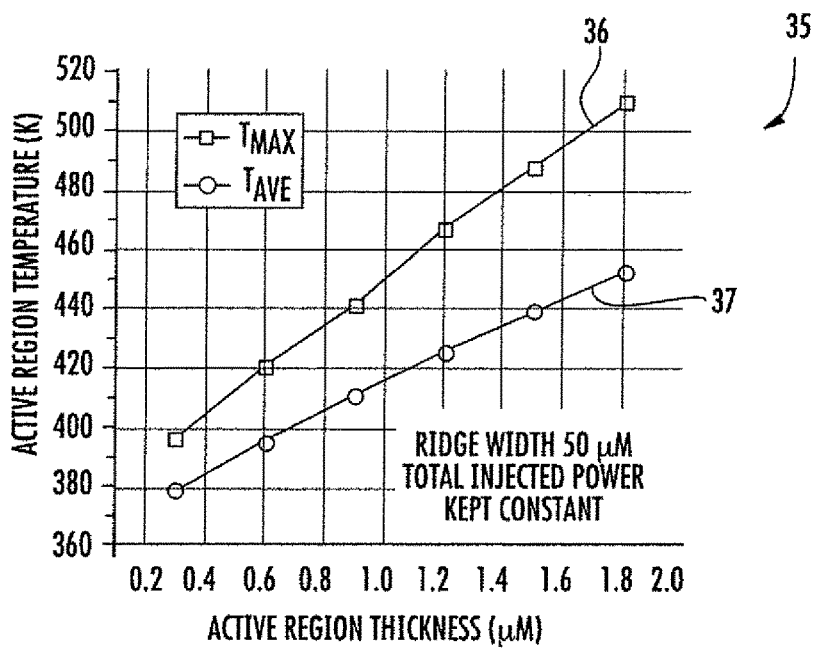
FIG. 5 is a diagram of active region temperature versus active region thickness, according to the present disclosure.

As shown in FIG. 5 (diagram 35, curve 36 is $T_{max}$, curve 37 is $T_{ave}$), however, active region thermal resistance can be drastically reduced and laser self-heating can be suppressed by reducing active region thickness. For the same total electrical power injected into the active region, $T_{max}/T_{ave}$ drops from 510K/452K to 420K/395K when active region thickness reduces from 1.8 µm to 0.6 µm. This data clearly demonstrates that reduction in active region thickness can lead to a dramatically lower active region temperature (up to 100K) and a much more uniform temperature distribution for the same total electrical power dissipated in the thinner active region, or, which is of primary interest here, to the same average temperature for much wider devices. This is a critical observation for scaling optical power with active region surface area.

Figure 6:
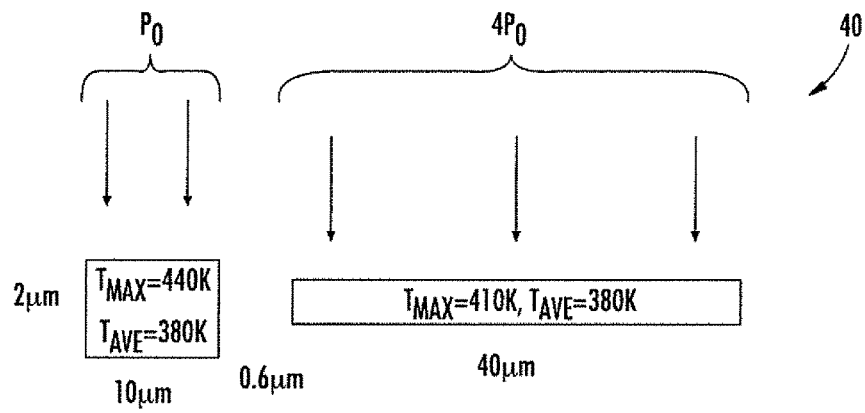
FIG. 6 is a schematic diagram for comparing active region heating for thick and narrow QCLs and proposed thin and wide QCLs, according to the present disclosure.

Numerical simulations similar to those presented in FIGS. 4-5 show that average active region temperature for 0.6 µm-thick, 40 µm-wide devices is almost exactly the same as for traditional narrow ridge (<10 µm) QCLs when total electrical power dissipated in the wider device is four times that for the narrower device (FIG. 6; diagram 40). In addition, maximum temperature at the center of the active region is only 410K, which is 30K lower than for traditional QCLs. Therefore, reduction in active region width presents a unique opportunity for reduction in active region temperature for broad area devices.

Optical Power Scaling for QCL Structures with Thin Active Region

Active region thickness can be reduced by either (a) reducing thickness of each stage in the cascade or (b) reducing number of cascades. The former approach will be discussed in the next section and implication of reduction in number of active region stages will be discussed in subsequent sections.

Short Injector, Low Voltage Design

A typical active region stage of a QCL comprises nine to ten QW/barrier pairs and its total thickness is approximately 50 nm. For a laser design based on a vertical laser transition, radiative transitions occur between the two laser states fully localized in just two out of ten QW/barrier pairs. The remaining pairs constitute so-called injector region that is used to thermalize electrons before they get injected into the next stage. Injector depth is considered to be a critical parameter: the injector needs to be deep enough to suppress carrier backscattering to the lower laser level. The downside of designing a laser with a deep injector is that the thermal energy lost by electrons in the injector is wasted: it turns to heat (phonons) rather than light (photons). Therefore, the optimal injector depth Δ, also known as voltage defect, is found through a tradeoff analysis between suppression of backscattering and wasted energy.

The rule of thumb used in QCL design is that the optimal Δ resulting into the highest device efficiency should be approximately 150 meV [4, 5]. This optimal value for Δ was found assuming that all electrons reside in a single (ground) injector state. It has recently been shown that presence of as many as ten injector states (resulting in a much higher density of states in the injector) significantly changes this rule. In particular, voltage defect of 100-110 meV [6] is sufficient to suppress carrier backscattering at room temperature. Since injector depth Δ is proportional to injector length, two to three QW/barrier pairs can be eliminated from each stage, which can result into as much as a 40% reduction in each stage thickness.

A design with a reduced number of layers is called a short-injector design. Short-injector structures are typically designed to operate at high electric fields to achieve Δ=150 meV across a shorter injector length. The main problem in this case is that it is much more difficult to confine electrons on the upper laser level at high electric fields: leakage through energy levels located above the upper laser level and through indirect states is projected to be higher at higher electric field due to Stark effect. However, since, as discussed above, Δ=110 meV is sufficient to suppress carrier backscattering to the lower laser level, a short-injector structure can be designed to operate at electric field comparable to that of traditional designs.

Figure 7:
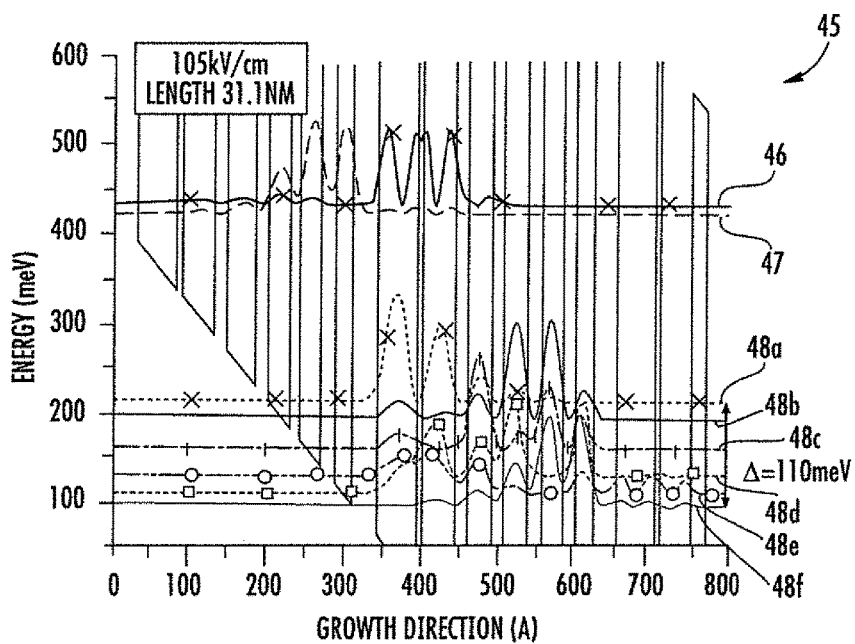
FIG. 7 is a diagram of energy versus growth direction, according to the present disclosure.

An exemplary short-injector, low voltage design is shown in FIG. 7 (diagram 45, curves 46-47, and curves 48a-48f show an injector depth Δ of 110 meV). Voltage defect in this structure was reduced to 110 meV, while preserving all other design parameters, such as vertical laser transition, suppression of carrier escape to energy levels above the upper laser level, and good overlap between injector states. Operational voltage for this structure is 105 kV/cm, comparable to that for traditional designs. Crucially, stage length for this structure was reduced from 50 nm to 31 nm (~40% reduction).

The 40% reduction in each stage thickness leads to a reduction in total active region thickness to 1.2 µm, which significantly helps to reduce active region temperature even when a 40-stage design is used. This is evident from FIG. 3.

It is important to note here that even though short-injector structures have been attempted before (See, e.g., Reference 7), a high device performance for short injector QCLs is still to be demonstrated. There are two main reasons for that: (a) a high-operational field used in laser design, which resulted into a low injection efficiency for the upper laser level and (b) increased backscattering due to reduced Δ. A rigorous laser efficiency analysis is required to account for the finite density of injector states to accurately predict backscattering as well as taking into account injection efficiency dependence on bias.

Injection efficiency is one of the critical design parameters with a strong impact on overall laser performance. Injection efficiency can be estimated based on rate equation as described in Reference 8. This approach, however, does not take into account direct carrier injection from the injector to states other than the upper laser level. It can be inferred from the results presented in Reference 9 that this carrier leakage path is likely to have a major effect on device performance. Specifically, it was explained in Reference 9 that dephasing time between the lowest injector state and the active region states involved in the tunneling process was much shorter than it had been previously believed. One of the main implications of that effect is a significantly higher direct carrier injection to states other than the upper laser level even for a large detuning between the initial and final states involved in the tunneling process. It is critical to make sure that the required design changes outlined above and below in the text do not lead to a reduced injections efficiency for the upper laser level.

Increase in Laser Dynamic Range for Structures with Low Number of Stages

Overall optical power is a product of laser dynamic range ($\Delta J_{DR}$) and slope efficiency (dP/dI):

$$P = S \cdot \Delta J_{DR} \cdot \frac{dP}{dI} \quad (4)$$

where S is active region area. Since the change in number of stages from 40 stages to 20 stages entails a proportional reduction in slope efficiency, $\Delta J_{DR}$ has to be significantly increased, by a factor of two, to keep total optical power emitted per unit area unchanged.

Maximum current density (at roll over) is described by the following formula [14]:

$$J_{max} = \frac{2en_s \Omega^2 \tau_\parallel}{1 + 4\Omega^2 \tau_\parallel \tau_4} \quad (5)$$

where $n_s$ is doping density, $2\hbar\Omega$ is injector/active region coupling (energy splitting between the lowest injector and the upper laser states at anticrossing), $\tau_4$—upper laser lifetime, and $\tau_\parallel$ is dephasing time between the lowest injector and the upper laser states.

With the exception of $\tau_\parallel$, all parameters in Equation 5 are well defined. The dephasing time is a more difficult parameter to calculate from first principles as it is a function of various carrier scattering processes. As a consequence, historically, it has been extracted from electroluminescence width data that gave a typical value of 40 fs. For $\tau_\parallel$=40 fs and $2\hbar\Omega$ equal to several meV, the second term in the denominator dominates the first one and Equation 5 reduces to:

$$J_{max} \approx \frac{en_s}{2\tau_4} \quad (6)$$

From this equation it follows that maximum current density is independent of coupling (strong coupling regime). Since further increase in coupling does not increase $J_{max}$ and, in addition, it "spreads" the laser transition between the transitions from the lowest injector and upper laser states, a conservative coupling of ~5 meV is typically used in MWIR QCL design.

It has been shown recently [9] that the approach of extracting dephasing time $\tau_\parallel$ from electroluminescence data is inaccurate since the lowest injector and the upper laser states involved in tunneling do not overlap significantly, while the upper and lower laser states involved in electroluminescence are localized in the same quantum wells. Specifically, it was estimated in Reference 9 that the dephasing time involved in the injection process is factor of five smaller than that extracted from electroluminescence data.

Figure 8:
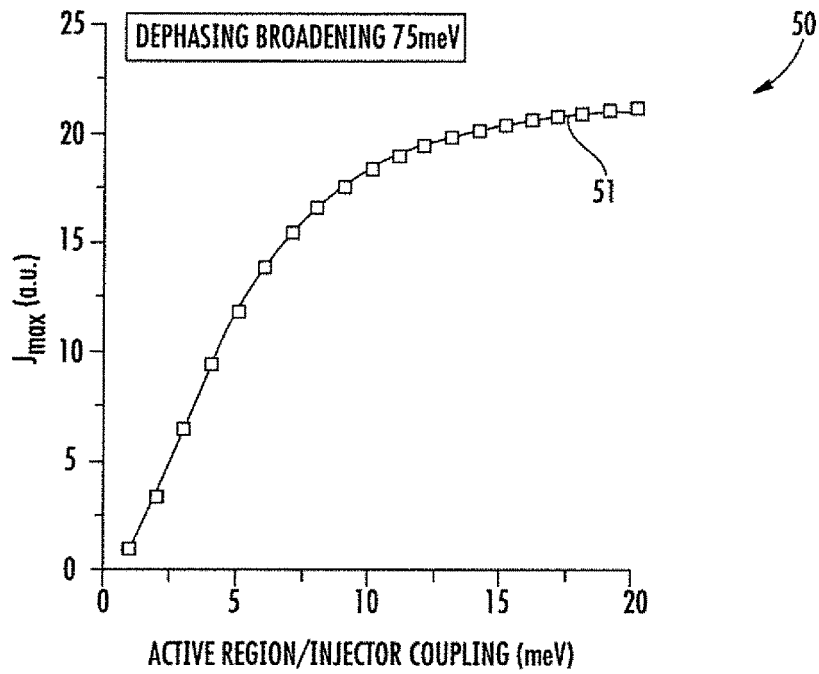
FIG. 8 is a diagram of current density versus active region/injector coupling, according to the present disclosure.

A much shorter dephasing time brings Formula 5 to so-called moderate coupling regime. In this case, an increase in coupling strength leads to increase in maximum current density. Specifically, increase in coupling from 5 meV to 10 meV leads to approximately 60% increase in maximum current as shown in FIG. 8 (diagram 50, curve 51).

In principle, a larger coupling strength reduces peak gain and, therefore, increases threshold current density. However, Formula 2 shows that for coupling increase from 5 meV to 10 meV, corresponding increase in threshold current density is low, estimated to be approximately 0.1 kA/cm².

Structures with a very large active region injector coupling have been investigated in [15]. However, while high pulsed efficiencies were reported for these devices, demonstrated CW efficiency was low. The most likely reason for that is carrier escape through parasitic energy levels located above the upper laser level. A relative contribution of this carrier leakage path is expected to increase for a large injector/active region coupling. To compensate for this effect, the high-lying energy states have to be pushed away from the injector, which will reduce spatial overlap between this subset of states and the injector states. As a consequence, direct carrier injection into those states will be suppressed despite increased active region/injector coupling.

Carrier Concentration on the Lowest Injector Level $n_s$ is typically interpreted in Formula 5 as active region doping. However, a more careful analysis shows that $n_s$ in that formula should be interpreted as carrier density in the lowest (ground) injector state. The reason for that is that, with the exception of the ground injector state, all the other injector states typically have suppressed coupling with the upper laser level (funnel injector design) and, as a consequence, carriers residing in those states do not significantly contribute to $J_{max}$.

Carrier concentration for the ground injector state can be increased (relative to the other injector states) by increasing energy separation between this state and the other injector states. Typical energy spacing between the two lowest injector states is 10-20 meV at roll over. Using a simple Boltzmann distribution, a fraction of carriers on the lowest injector level can be estimated to be ~0.6 for $E_{inj,1-2}$=15 meV. However, carrier density on the lowest injector level can be increased to ~0.8 by increasing $E_{inj,1-2}$ from 15 meV to 35 meV.

Figure 9:
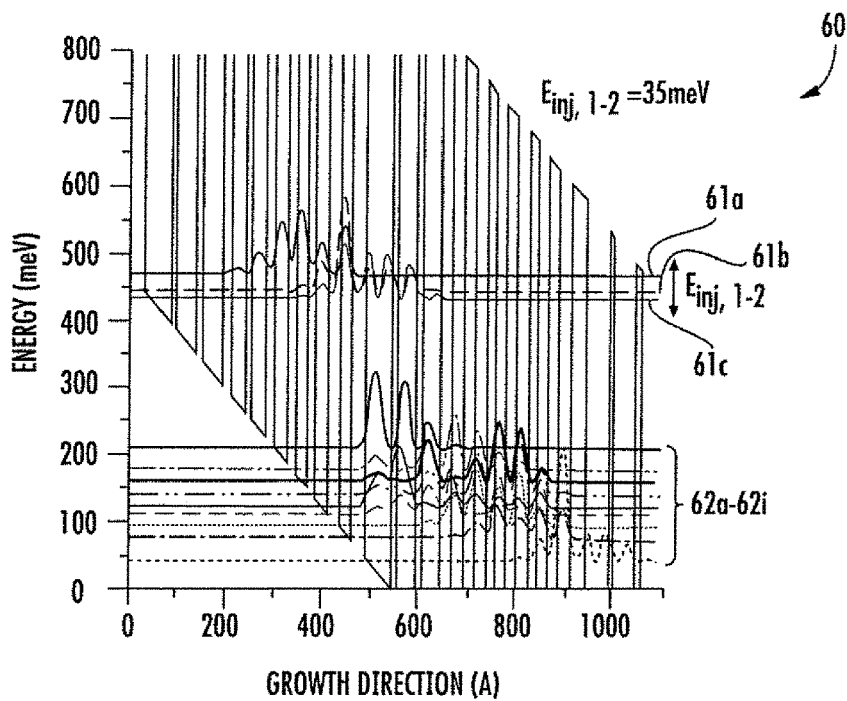
FIG. 9 is a diagram of energy versus growth direction, according to the present disclosure.

FIG. 9 (diagram 60) shows an exemplary design with $E_{inj,1-2}$=35 meV with curves 61a-61c. Curves 62a-62i show other injector states. $E_{inj,1-2}$ can be further increased, above 40 meV, for carrier concentration on the ground injector state to reach approximately 90%.

In addition to increase in $J_{max}$, designing a structure with a large $E_{inj,1-2}$ has two other subtle advantages:

1. Intersubband losses are one of the main contributors to total waveguide losses. These losses mostly originate from transitions between injector states with a large overlap. Since, the ground state is typically designed to be mostly localized in the last (single) QW, its overlap with other injector states and corresponding matrix elements are low. Therefore, structures with large $E_{inj,1-2}$ with carriers mostly concentrated in the ground injector level are expected to have lower intersubband losses.

2. $E_{inj,1-2}$>LO phonon energy (~32 meV) increases carrier scattering rate from high injector states to the ground injector state through interaction with LO phonons.

The effect of increasing $E_{inj,2-1}$ has never been studied before. In principle, following the same logic, it is expected that a significant reduction in laser temperature should lead to increase in $J_{max}$ as a larger fraction of carriers will resides on the ground injector state at lower temperatures. This is typically observed in experiment. However, other parameters, such upper laser lifetime and dephasing time, also depend on temperature, which complicates data analysis. Therefore, a better experiment in this case is to compare $J_{max}$ for two structures with significantly different $E_{inj,2-1}$ (but otherwise very similar structures) at the same temperature. Based on our projections, $E_{inj,2-1}$ will likely turn out to be a very important design parameter that can be relatively easily controlled to significantly improve laser performance.

Possible Applications for 2D High-Power, Broad Area Superlattice

CG-SE-DFB Configuration

Figure 10:
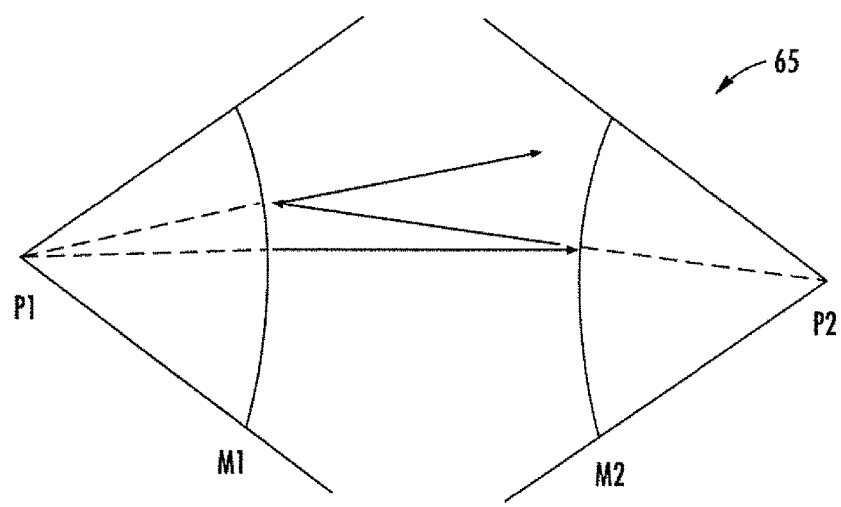
FIG. 10 is a schematic diagram of an unstable resonator with two spherical mirrors, according to the present disclosure.

The CG-SE-DFB configuration, briefly described in introduction, is analogous to an unstable resonator with a distributed feedback. Operational principles of an unstable resonator can be illustrated using the ray optics approach. FIG. 10 (diagram 65) shows an example of an unstable resonator with two spherical mirrors. The right going wave in this configuration is a spherical wave with a virtual center at $P_1$. When this wave is deflected by the right mirror $M_2$, the reflected beam has a virtual center at $P_2$. Upon the next reflection from $M_1$, the virtual center for the optical ray changes back to $P_1$. This creates a reproducible optical mode pattern for the fundamental mode in the space between the mirrors as if it was created by two point sources. The main source of discrimination between the lateral modes is due to different "diffraction losses" for different order modes. The term "diffraction losses" stands here for losses due to rays eventually bouncing outside the waveguide confined by the two mirrors.

The main advantage of the unstable resonator configuration is that it allows for scaling of optical power with lateral waveguide dimensions without compromising output beam quality. This configuration has been attempted for semiconductor lasers with various degrees of success. The early attempts to form the curved output mirrors of Fabry-Perot semiconductor laser chips by grinding, did not result into a high laser performance [17]. It was later improved employing dry etching [18]. However, the best performance was achieved for unstable-resonator diode lasers utilizing a distributed feedback. In these devices the traditional straight-line shape of the DFB groves was changed to a curved shape (most often concentric circles). Each pair of the groves with the same radius (on the opposite sides of a symmetric device) is designed to produce the effect similar to the one described above, i.e. designed so that optical ray reflection from them results into an interference pattern of two point sources located at $P_1$ and $P_2$. Grating radius in this case has to be continuously changing along the device length for all reflections to have the same virtual centers $P_1$ and $P_2$ [19].

For all semiconductor lasers, including QCLs, catastrophic optical damage and active region overheating in CW mode are two serious issues limiting device performance. Therefore, a configuration compatible with epi-down device mounting and beam extraction through the substrate (large aperture size) can significantly benefit high power laser performance. In the case of CG-SE-DFB lasers, this can be achieved by using a second rather than the first order diffraction grating. Research on the $2^{nd}$ order CG-SE-DFB diode lasers is still ongoing and it has already resulted in demonstration of 70 W single NIR emitters, a record-high power level for diode lasers [20]. The concept of CG-SE-DFB has never been attempted for QCLs.

One of the main potential problems for IR substrate-emitting devices is optical losses in the doped substrate. However, using the Drude model these losses were estimated to be less than 5% for QCLs emitting in the 3 to 5 μm range. It was assumed in this analysis that the QCL structure was grown on a low doped ($10^{17}$ cm$^{-3}$) 100 μm-thick InP substrate, which is a standard practice in the QCL field.

CG-SE-DFB QCLs promises high power operation with a nearly ideal beam quality. However, for some applications, beam quality exceeding the diffraction limit by a factor of 2 to 5 is acceptable. For these applications, we will explore two more (much simpler) high power laser configurations utilizing the 2D high power, broad area superlattice design.

Angled Cavity Configuration

Figure 11A:
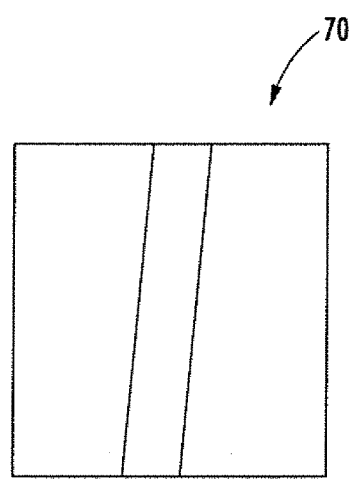
FIGS. 11A and 11B are schematic views of an angled cavity and a tapered cavity laser, respectively, according to the present disclosure.

It has been shown in reference [23] that a very high peak optical power with $M^2 \sim 5$ can be obtained for QCLs with ridge width of several hundred microns when the angle between the ridge and laser facets deviates from 90 degrees (FIG. 11A; diagram 70). Since optical mode filamentation is suppressed in CW QCLs and since we will be utilizing much narrower ridges, $M^2$ of 5 is the upper limit for what can be expected for the new devices in CW mode. A big advantage of this configuration is that it does not involve the expensive InP:Fe overgrowth. As a consequence, price per watt for these devices will be approximately ten times lower than for the traditional Fabry Perot QCLs.

Tapered Configuration

Figure 11B:
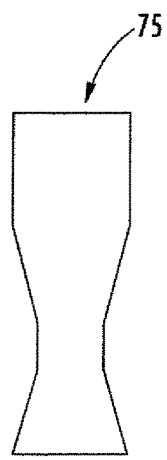

Another option to reach a very high power CW operation with a good beam quality is to utilize tapered QCLs, as shown in FIG. 11B (diagram 75). The central narrow section is used to suppress high order modes, while the wider section increases the active region volume and, as a consequence, total optical power.

Both angled cavity and tapered configuration can be used for such applications as IR beacons and illuminators where nearly ideal beam quality is not critical.

TECHNICAL APPROACH SUMMARY

References (all References Listed Below are Hereby Incorporated by Reference in their Entireties)

References

[1] D. Wintz, P. Genevet, A. Ambrosio, A. Woolf, and F. Capasso, Nanoletters 15, 3585 (2015)
[2] J. Lee, M. Tymchenko, C. Argyropoulos, P. Chen, F. Lu, F. Demmerle, G. Boehm, M Amann, A. Alu, and M. Belkin, Nature 511, 65 (2014)
[3] B. Schwarz, P. Reininger, D. Ristanic, H. Detz, A. Andrews, W. Schrenk, and G. Strasser, Nature Communications 5, 4085 (2014)
[4] J. Faist, Applied Physcis Letters 90, 253512 (2007)
[5] S. Howard, Z. Liu, D. Wasserman, A. Hoffman, T. Ko, and C. Gmachl, IEEE J. Sel. Top. Quantum Electron. 13, 1054 (2007)
[6] R. Maulini, A. Lyakh, A. Tsekoun, and C. Patel, Optics Express 19, 17203 (2011)
[7] H. Li, S. Katz, A. Vizbaras, G. Boehm, and M.-C. Amann, IEEE Photonics Technology Letters 22, 1811 (2010)
[8] D. Botez, S. Kumar, J. C. Shin, L. J. Mawst, I. Vurgaftman, and J. R. Meyer, Applied Physics Letters 97, 071101 (2010)
[9] J. Khurgin, Y. Dikmelik, P. Liu, A. Hoffman, M. Escarra, K. Franz, and C. Gmachl, Applied Physics Letters 94, 091101 (2009)
[10] M. Razeghi, IEEE J. Sel. Top. Quantum Electron. 15, 941 (2009)
[11] A. Lyakh, R. Maulini, A. Tsekoun, R. Go, and C. Patel, Optics Express 20, 24272 (2012)
[12] R. Maulini, A. Lyakh, A. Tsekoun, R. Go, C. Pflugl, L. Diehl, F. Capasso, and C. Patel, Applied Physics Letters 95, 151112 (2009)
[13] A. Lyakh, R. Maulini, A. Tsekoun, R. Go, and C. Patel, Optics Express 20, 4382 (2012)
[14] R. Kazarinov and R. Suris, Sov. Phys. Semicond. 5, 707 (1971)
[15] Y. Yao, X. Wang, J. Fan, and C. Gmachl, Applied Physics Letters 97, 081115 (2010)
[16] T. Aellen, M. Beck, N. Hoyler, M. Giovannini, E. Gini, and J. Faist, Applied Physics Letters 100, 043101 (2006)
[17] A. Bogatov, P. Eliseev, M. Manko, G. Mikaelyan, and Y. Popov, Sov. J. Quantum Electronics 10, 620 (1980)
[18] E. Deichsel, R. Jager, and P. Unger, Japanese Journal of Applied Physics 41, 4279 (2002)
[19] R. Lang, IEEE J. Quantum Electronics 30, 31 (1994)
[20] M. Kanskar, J. Cai, D. Kedlaya, D. Olson, Y. Xiao, T. Klos, M. Martin, C. Galstad, and S. Macomber, Proceedongsof SPIE 7686, 76860J-1 (2009)
[21] S. Macomber, Proceedings of SPIE 4993, 37 (2003)
[22] S. Macomber, J. Mott, B. Schwartz, R. Setzko, J. Powers, P. Lee, D. Kwo, R. Dixon, and J. Logue, SPIE 3001 (1997)
[23] Y. Bai, N. Bandyopadhayay, S. Tsao, S. Slivken, and M. Razeghi, Applied Physics Letters 98, 181102 (2011)

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A quantum cascade laser (QCL) comprising:
   a substrate;
   a semiconductor layer adjacent said substrate and defining an active region; and
   said active region having an elongate shape extending laterally across said substrate and having first and second lowest injector states with an energy spacing being greater than 20 meV.

2. The QCL of claim 1 wherein a thickness of said active region is less than or equal to 1.3 µm; and wherein a width of said active region is greater than or equal to 20 µm.

3. The QCL of claim 1 wherein a low voltage, short injector design is used with stage thickness less than 40 nm.

4. The QCL of claim 1 wherein an active region/injector coupling value exceeds 7 meV to increase dynamic range of the QCL.

5. The QCL of claim 1 further comprising an optical grating adjacent said active region and configured to emit a continuous wave (CW) laser output through said substrate; and wherein said optical grating comprises a second order optical grating pattern.

6. The QCL of claim 5 wherein said optical grating comprises a curved grating pattern based upon a phase function.

7. The QCL of claim 5 wherein said optical grating is configured to emit the CW laser output at a power greater than or equal to 20 watts.

8. The QCL of claim 1 wherein said active region has a tapered shape.

9. The QCL of claim 1 wherein said active region has an angled shape.

10. The QCL of claim 1 wherein said active region has a thickness of less than or equal to 1.2 µm.

11. The QCL of claim 1 wherein said semiconductor layer comprises a plurality of layers defining a superlattice structure.

12. A quantum cascade laser (QCL) system comprising:
    a QCL comprising
       a substrate,
       a semiconductor layer adjacent said substrate and defining an active region, and
       said active region having an elongate shape extending laterally across said substrate and having first and second lowest injector states with an energy spacing being greater than 20 meV; and
    a driver circuit coupled to said QCL.

13. The QCL system of claim 12 wherein a thickness of said active region is less than or equal to 1.3 µm; and wherein a width of said active region is greater than or equal to 20 µm.

14. The QCL system of claim 12 wherein a low voltage, short injector design is used with stage thickness less than 40 nm.

15. The QCL system of claim 12 wherein an active region/injector coupling value exceeds 7 meV to increase dynamic range of the QCL.

16. The QCL system of claim 12 wherein said QCL comprises an optical grating adjacent said active region and configured to emit a continuous wave (CW) laser output through said substrate; and wherein said optical grating comprises a second order optical grating pattern.

17. The QCL system of claim 16 wherein said optical grating comprises a curved grating pattern based upon a phase function.

18. A method for making a quantum cascade laser (QCL) comprising:
    forming a semiconductor layer adjacent a substrate and defining an active region; and
    the active region having an elongate shape extending laterally across the substrate and having first and second lowest injector states with an energy spacing being greater than 20 meV.

19. The method of claim 18 wherein a thickness of said active region is less than or equal to 1.3 µm; and wherein a width of said active region is greater than or equal to 20 µm.

20. The method of claim 18 wherein a low voltage, short injector design is used with stage thickness less than 40 nm.

21. A quantum cascade laser (QCL) comprising:
    a substrate;
    a semiconductor layer adjacent said substrate and defining an active region; and
    an optical grating adjacent said active region and configured to emit a laser output through said substrate, said optical grating comprising an optical grating pattern;
    said active region having an elongate shape extending laterally across said substrate and having first and second lowest injector states with an energy spacing being greater than 20 meV.

22. A method for making a quantum cascade laser (QCL) comprising:
    forming a semiconductor layer adjacent a substrate and defining an active region;
    the active region having an elongate shape extending laterally across the substrate and having first and second lowest injector states with an energy spacing being greater than 20 meV; and
    forming an optical grating adjacent the active region and configured to emit a laser output through the substrate, the optical grating comprising an optical grating pattern.

* * * * *